United States Patent
Yuan et al.

(10) Patent No.: US 8,643,408 B2
(45) Date of Patent: Feb. 4, 2014

(54) FLIP-FLOP CIRCUIT, FREQUENCY DIVIDER AND FREQUENCY DIVIDING METHOD

(75) Inventors: Min-Shueh Yuan, Taipei (TW); Chien-Hung Chen, Taipei (TW); Shao-Yu Li, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/569,568

(22) Filed: Aug. 8, 2012

(65) Prior Publication Data
US 2013/0187686 A1 Jul. 25, 2013

Related U.S. Application Data

(60) Provisional application No. 61/589,067, filed on Jan. 20, 2012.

(51) Int. Cl.
*H03K 21/00* (2006.01)
*H03B 19/00* (2006.01)

(52) U.S. Cl.
USPC .......................................... 327/115; 327/117

(58) Field of Classification Search
USPC ......... 327/218, 201–203, 206, 208, 212, 214, 327/115, 117, 118
See application file for complete search history.

(56) References Cited

U.S. PATENT DOCUMENTS 7,952,399 B1 * 5/2011 Cadotte, Jr. .................. 327/117
7,973,574 B2 * 7/2011 Oh ................................ 327/115

* cited by examiner

*Primary Examiner* — Hai L Nguyen
(74) *Attorney, Agent, or Firm* — Lowe Hauptman & Ham, LLP

(57) ABSTRACT

In response to a first level of the clock signal, an inverting output of a flip-flop circuit is connected, via a non-inverting input thereof, to a first intermediate node of the flip-flop circuit and a non-inverting output of the flip-flop circuit is connected, via an inverting input thereof, to a second intermediate node of the flip-flop circuit. In response to a second level of the clock signal, the first intermediate node is connected, via a third intermediate node of the flip-flop circuit, to the non-inverting output and the second intermediate node is connected, via a fourth intermediate node of the flip-flop circuit, to the inverting output. A first cross-coupled gates arrangement of the flip-flop circuit is coupled between the first and second intermediate nodes. A second cross-coupled gates arrangement of the flip-flop circuit is coupled between the third and fourth intermediate nodes.

20 Claims, 9 Drawing Sheets

FLIP-FLOP CIRCUIT, FREQUENCY DIVIDER AND FREQUENCY DIVIDING METHOD

CROSS-REFERENCE TO RELATED APPLICATION

The present application claims priority of U.S. Provisional Patent Application No. 61/589,067, filed on Jan. 20, 2012, which is incorporated herein by reference in its entirety.

BACKGROUND

Frequency dividers are widely used as key building blocks in Phase Locked Loops (PLLs). Frequency dividers are configured to provide signals of frequencies different from the frequency of a clock signal to thereby reduce speed and simplify digital circuitry. Several characteristics of a frequency divider include speed performance, duty cycle, rail to rail clock output etc.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1A:
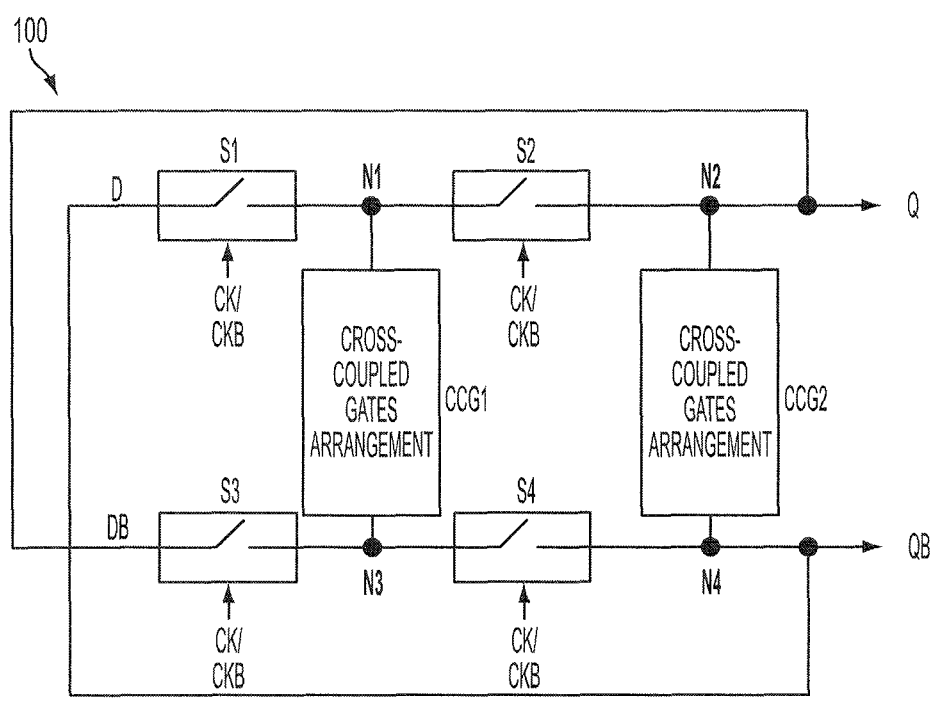
FIG. 1A is a schematic circuit diagram of a flip-flop circuit in accordance with some embodiments.

It is to be understood that the following disclosure provides many different embodiments or examples, for implementing different features of various embodiments. Specific examples of components and arrangements are described below to simplify the present disclosure. The inventive concept may, however, be embodied in many different forms and should not be construed as being limited to the embodiments set forth herein; rather, these embodiments are provided so that this description will be thorough and complete, and will fully convey the inventive concept to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the inventive concept.

FIG. 1A is a schematic circuit diagram of a flip-flop circuit 100 in accordance with some embodiments. The flip-flop circuit 100 comprises a first input D, a second input DB, a first output Q, a second output QB, first through fourth intermediate nodes N1-N4, first through fourth switches S1-S4, and first and second cross-coupled gates arrangements CCG1 and CCG2. In the embodiment specifically disclosed in FIG. 1A, the first input D is a non-inverting input, the second input DB is an inverting input, the first output Q is a non-inverting output, and the second output QB is an inverting output. Alternatively, in one or more embodiments, the first input is an inverting input, the second input is a non-inverting input, the first output is an inverting output, and the second output is a non-inverting output. The notations "DB" and "$\overline{D}$" are interchangeably used herein, and the notations "QB" and "$\overline{Q}$" are interchangeably used herein.

In the flip-flop circuit 100, the first output Q is coupled to the second input DB, and the second output QB is coupled to the first input D. The first and second switches S1, S2 are coupled in series between the first input D and the first output Q. The first intermediate node N1 is positioned between the first and second switches S1, S2. The second intermediate node N2 is positioned between the second switch S2 and the first output Q. The third and fourth switches S3, S4 are coupled in series between the second input DB and the second output QB. The third intermediate node N3 is positioned between the third and fourth switches S3, S4. The fourth intermediate node N4 is positioned between the fourth switch S4 and the second output QB.

The first cross-coupled gates arrangement CCG1 is coupled between the first and third intermediate nodes N1, N3. The second cross-coupled gates arrangement CCG2 is coupled between the second and fourth intermediate nodes N2, N4. As used herein, a "cross-coupled gates arrangement" includes a pair of semiconductor devices each of which has an input coupled to an output of the other semiconductor device and vice versa. Examples of semiconductor devices include, but are not limited to, logic gates. Examples of logic gates include, but are not limited to, AND gate, OR gate, NOT gate (inverter), NAND gate, NOR gate, XNOR gate etc. In some embodiments, each logic gate includes a combination of other logic gates. In some embodiments, each semiconductor device in a cross-coupled gates arrangement includes a combination of logic gates. In some embodiments, each cross-coupled gates arrangement includes a latch.

The first and third switches S1, S3 are configured to be closed in response to a first level (e.g., a HIGH or H level) of a clock signal CK, and opened in response to a second level (e.g., a LOW or L level) of the clock signal CK. The second and fourth switches S2, S4 are configured to be opened in response to the first level of the clock signal CK and closed in response to the second level of the clock signal CK.

Figure 1B:
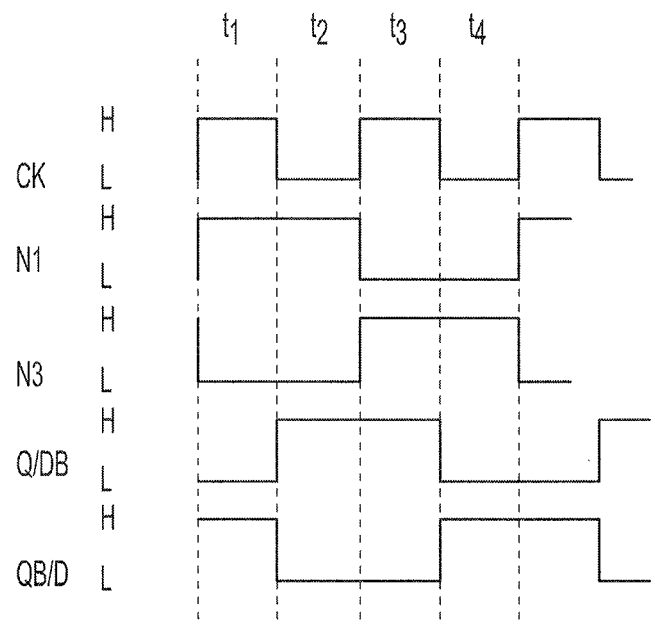
FIG. 1B is a timing diagram of an operation of the flip-flop circuit of FIG. 1A.

FIG. 1B is a timing diagram of an operation, in accordance with in some embodiments, of the flip-flop circuit 100 of FIG. 1A. Specifically, during a first time period t1, i.e., at the first level, e.g., H, of the clock signal CK, the first switch S1 and the third switch S3 are closed while the second switch S2 and the fourth switch S4 are opened. The second output QB is connected via the first input D to the first intermediate node N1, and the first output Q is connected via the second input DB to the third intermediate node N3. Assuming that the signal levels at the first output Q and second output QB are L and H, respectively, then the signal levels at the first intermediate node N1 and third intermediate node N3 are H and L, respectively.

The signal levels at the first intermediate node N1 and third intermediate node N3 are maintained (or latched) from the first time period t1 to a subsequent, second time period t2, by the first cross-coupled gates arrangement CCG1 coupled between the first and third intermediate nodes N1, N3.

During the second time period t2, i.e., at the second level, e.g., L, of the clock signal CK, the first switch S1 and the third switch S3 are opened while the second switch S2 and the fourth switch S4 are closed. The first intermediate node N1 is connected via the second intermediate node N2 to the first output Q, and the third intermediate node N3 is connected via the fourth intermediate node N4 to the second output QB. The corresponding signal levels H and L of the first intermediate node N1 and third intermediate node N3, which were latched by the first cross-coupled gates arrangement CCG1, are thus transferred to the first output Q and second output QB, and switch the signal level at the first output Q from L to H and the signal level at the second output QB from H to L.

The signal levels at the second intermediate node N2 and fourth intermediate node N4 are maintained (or latched) from the second time period t2 to a subsequent, third time period t3, by the second cross-coupled gates arrangement CCG2 coupled between the second and fourth intermediate nodes N2, N4. Thus, the signal levels at the first output Q and second output QB are also maintained by the second cross-coupled gates arrangement CCG2 from the second time period t2 to the third time period t3.

During the third time period t3, i.e., at the first level, e.g., H, of the clock signal CK, the first switch S1 and the third switch S3 are closed while the second switch S2 and the fourth switch S4 are opened. The second output QB is connected via the first input D to the first intermediate node N1, and the first output Q is connected via the second input DB to the third intermediate node N3. The corresponding signal levels H and L of the first output Q and second output QB, which were latched by the second cross-coupled gates arrangement CCG2, are thus transferred to the first intermediate node N1 and third intermediate node N3, and switch the signal level at the first intermediate node N1 from H to L and the signal level at the third intermediate node N3 from L to H.

The signal levels at the first intermediate node N1 and third intermediate node N3 are maintained (or latched) from the third time period t3 to a subsequent, fourth time period t4, by the first cross-coupled gates arrangement CCG1 coupled between the first and third intermediate nodes N1, N3.

During the fourth time period t4, i.e., at the second level, e.g., L, of the clock signal CK, the first switch S1 and the third switch S3 are opened while the second switch S2 and the fourth switch S4 are closed. The first intermediate node N1 is connected via the second intermediate node N2 to the first output Q, and the third intermediate node N3 is connected via the fourth intermediate node N4 to the second output QB. The corresponding signal levels L and H of the first intermediate node N1 and third intermediate node N3, which were latched by the first cross-coupled gates arrangement CCG1, are thus transferred to the first output Q and second output QB, and switch the signal level at the first output Q from H to L and the signal level at the second output QB from L to H.

The process is then repeated as described with respect to the time periods t1-t4.

As can be seen intrinsic frequency 1B, the output signals of the flip-flop circuit 100 at the first output Q and second output QB follow the input clock signal CK at a frequency being half of the frequency of the clock signal CK. The flip-flop circuit 100 operates as a divide-by-two (DIV2) frequency divider. In some embodiments, more than one flip-flop circuits 100 are coupled in series (cascades) to obtain a frequency divisor of four, eight etc. In some embodiments, a frequency divisor other than two, four, or eight etc. is also obtainable by various techniques known or to be developed in the art.

In some embodiments, the clock signal CK and/or an inverted clock signal CKB is/are applied to each of the first through fourth switches S1-S4 to control the switches to open or close as described above. The inverted clock signal CKB is an inverted signal of the clock signal and is also interchangeably referred to herein as "$\overline{CK}$".

In some embodiments where only the clock signal CK or only the inverted clock signal CKB is applied to each of the first through fourth switches S1-S4, the flip-flop circuit 100 is referred to as a flip-flop circuit with single-end input clock. Each of the first through fourth switches S1-S4 is implemented by any electronic switching device controllable by the clock signal CK or inverted clock signal CKB. In some embodiments, the first through fourth switches S1-S4 include one or more PMOS and/or NMOS transistors the gates of which are coupled to receive the clock signal CK or inverted clock signal CKB. For example, the first switch S1 and third switch S3 are NMOS transistors which are turned ON (or closed) in response to the H level of the clock signal CK applied thereto, whereas the second switch S2 and fourth switch S4 are PMOS transistors are turned ON (or closed) in response to the L level of the clock signal CK applied thereto. The turning ON (or OFF) of a PMOS or NMOS transistor depends on the threshold voltage thereof, i.e., an NMOS transistor is turned ON when the signal level of the clock signal CK is at or higher than the threshold voltage of the NMOS transistor, whereas a PMOS transistor is turned ON when the signal level of the clock signal CK is at or lower than the threshold voltage of the PMOS transistor. As a result, the flip-flop circuit 100 with single-end input clock under certain circumstances (e.g., at a low supply voltage) exhibits a slower than expected speed due to the threshold voltages of the PMOS or NMOS transistors defining the first through fourth switches S1-S4.

In some embodiments, speed improvement is obtainable by applying both the clock signal CK and the inverted clock signal CKB to at least one of the first through fourth switches S1-S4. In this case, the flip-flop circuit 100 is referred to as a flip-flop circuit with differential input clock. In some embodiments, both the clock signal CK and the inverted clock signal CKB are applied to each of the first through fourth switches S1-S4. Each of the first through fourth switches S1-S4, which is configured to receive both the clock signal CK and inverted clock signal CKB, is implemented by any electronic switching device having multiple control terminals.

Figure 1C:
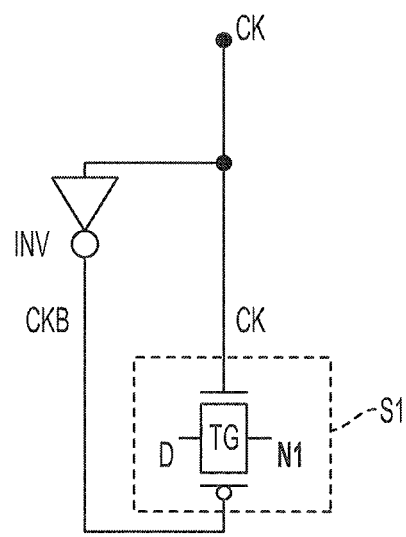
FIG. 1C is a schematic circuit diagram of a switch in accordance with some embodiments, for use in the flip-flop circuit of FIG. 1A.

FIG. 1C is a schematic circuit diagram of the first switch S1 implemented by a transmission gate TG in some embodiments. In one or more embodiments, the transmission gate TG is a complementary metal-oxide-semiconductor (CMOS) transmission gate. The CMOS transmission gate includes a PMOS transistor and an NMOS transistor. The gates of the PMOS transistor and the NMOS transistor define negative and positive control terminals of the CMOS transmission gate. The positive control terminal is connected to receive the clock signal CK, and the negative control terminal is connected to receive the inverted clock signal CKB which is generated from the clock signal CK by an inverter INV. The source of the NMOS transistor is coupled to the drain of the PMOS transistor and defines a terminal of the CMOS transmission gate that is connected to the first input D. The source of the PMOS transistor is coupled to the drain of the NMOS transistor and defines another terminal of the CMOS transmission gate that is connected to the first intermediate node N1. The transmission gate TG is turned ON (closed) by the H level of the clock signal CK and/or the L level of the inverted clock signal CKB to connect the first input D and the first intermediate node N1. The transmission gate TG is turned OFF (opened) by the L level of the clock signal CK and/or the H level of the inverted clock signal CKB to disconnect the first input D and the first intermediate node N1.

In some embodiments, the third switch S3, when configured to receive both the clock signal CK and the inverted clock signal CKB, is implemented by a transmission gate TG similar to that of the first switch S1. The second switch S2 and/or fourth switch S4, when configured to receive both the clock signal CK and the inverted clock signal CKB, is implemented by a transmission gate TG which is different from the transmission gate TG of the first switch S1 in that the positive control terminal is connected to receive the inverted clock signal CKB, and the negative control terminal is connected to receive the clock signal CK.

In some embodiments, the flip-flop circuit 100 with differential input clock is configured to receive both the clock signal CK and the inverted clock signal CKB from external circuitry. In some embodiments, the flip-flop circuit 100 with differential input clock is configured to receive one of the clock signal CK and the inverted clock signal CKB, and to internally generate the other clock signal (e.g., by way of an inverter such as the inverter INV).

Figure 2:
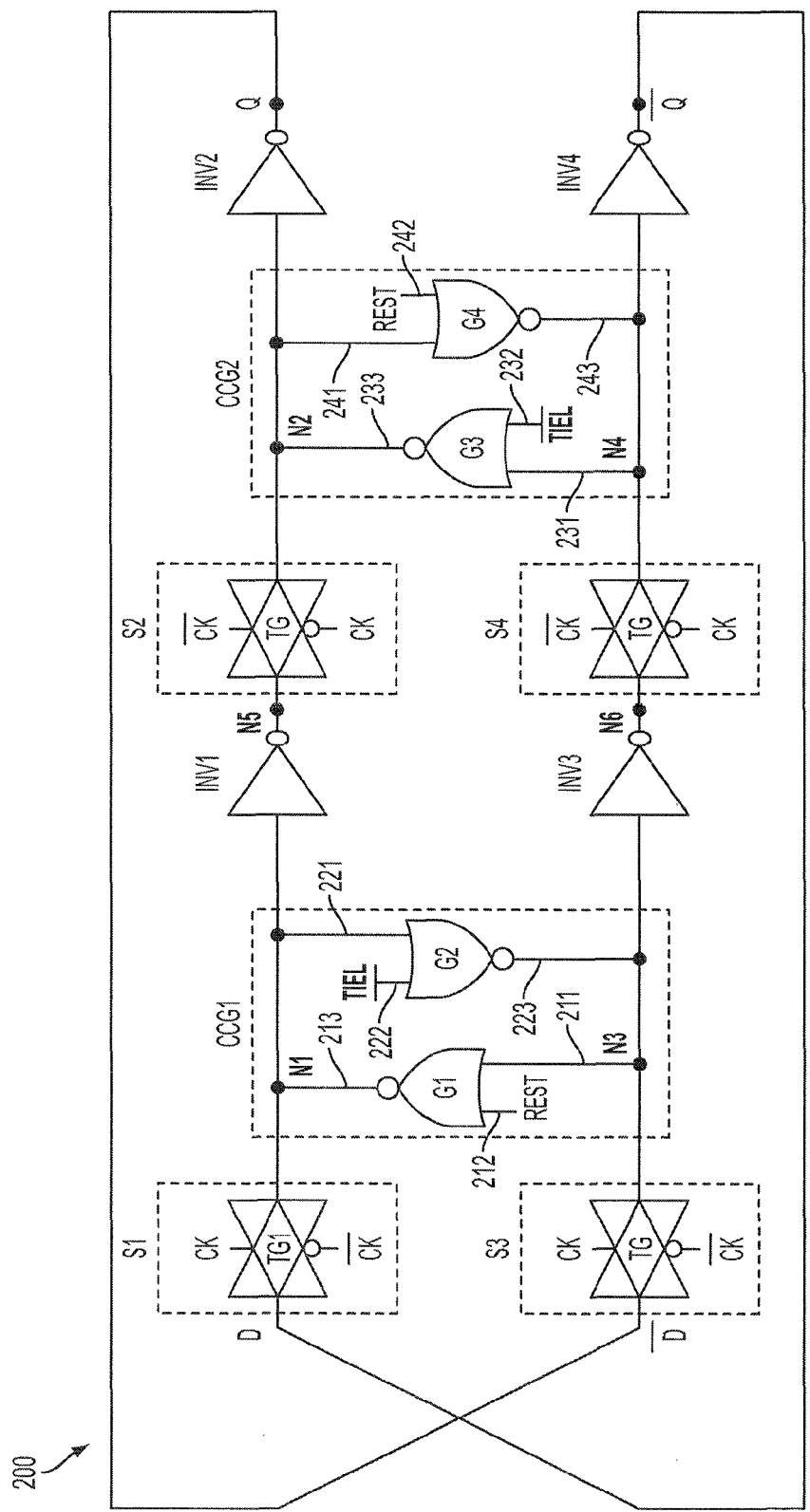
FIG. 2 is a schematic circuit diagram of a flip-flop circuit in accordance with some embodiments.

FIG. 2 is a schematic circuit diagram of a flip-flop circuit 200 in accordance with some embodiments. The flip-flop circuit 200 is a flip-flop circuit with differential input clock in which all first through fourth switches S1-S4 are implemented as transmission gates TG.

The flip-flop circuit 200 further includes first through fourth inverters INV1-INV4. The first inverter INV1 is coupled between the first intermediate node N1 and the second switch S2. The second inverter INV2 is coupled between the second intermediate node N2 and the first output Q. The third inverter INV3 is coupled between the third intermediate node N3 and the fourth switch S4. The fourth inverter INV4 is coupled between the fourth intermediate node N4 and the second output QB. A fifth intermediate node N5 is positioned between the first inverter INV1 and the second switch S2. A sixth intermediate node N6 is positioned between the third inverter INV3 and the fourth switch S4.

In the flip-flop circuit 200, the first cross-coupled gates arrangement CCG1 includes first and second logic gates G1, G2, and the second cross-coupled gates arrangement CCG2 includes third and fourth logic gates G3, G4. The first logic gate G1 includes a first input 211 coupled to an output 223 of the second logic gate G2 and also to the third intermediate node N3. The second logic gate G2 includes a first input 221 coupled to an output 213 of the first logic gate G1 and also to the first intermediate node N1. The third logic gate G3 includes a first input 231 coupled to an output 243 of the fourth logic gate G4 and also to the fourth intermediate node N4. The fourth logic gate G4 includes a first input 241 coupled to an output 233 of the third logic gate G3 and also to the second intermediate node N2.

One of the first and second logic gates, e.g., the second logic gate G2, includes a second input 222 coupled to a node TIEL of a predetermined logic level. For example, in the specific embodiment illustrated in FIG. 2 where the second logic gate G2 is a NOR gate, the node TIEL is a tied-low node which is tied to a low voltage corresponding to a LOW logic level. In one or more embodiments, the node TIEL is either grounded or connected to a ground voltage terminal VSS via a tie-low circuit. With a LOW signal (from the node TIEL) at one of the inputs of the NOR gate G2, the output (third intermediate node N3) is switched by and inverted from the logic level at the other input (first intermediate node N1).

Similarly, one of the third and fourth logic gates, e.g., the third logic gate G3, includes a second input 232 coupled to a node TIEL of a predetermined logic level (e.g., the LOW level).

The other of the first and second logic gates, e.g., the first logic gate G1, includes a second input 212 which is coupled to a reset input REST to receive a reset signal for resetting the flip-flop circuit 200. Similarly, the other of the third and fourth logic gates, e.g., the fourth logic gate G4, includes a second input 242 which is coupled to the reset input REST to receive the reset signal. In some embodiments, the reset signal is a system reset signal and/or an error reset signal. The system reset signal is supplied by external circuitry. The error reset signal is supplied by an error detection circuit as described below.

Normally, the reset signal is at a LOW level, the output (first intermediate node N1) of the first logic gate G1 is switched by and inverted from the logic level at the first input (third intermediate node N3), and the output (fourth intermediate node N4) of the fourth logic gate G4 is switched by and inverted from the logic level at the first input (second intermediate node N2). If the reset signal at a HIGH level is applied to the reset input REST, the output (first intermediate node N1) of the first logic gate G1 is reset to the LOW level (logical zero), the output (fourth intermediate node N4) of the fourth logic gate G4 is reset to the LOW level (logical zero), and the flip-flop circuit 200 is reset.

In some embodiments, logic gates other than NOR gates, e.g., inverters or NAND gates, are used as one or more of the first through fourth logic gates G1-G4. Depending on the particular type of logic gate being used, the node TIEL of any, or both, of the first cross-coupled gates arrangement CCG1 and second cross-coupled gates arrangement CCG2 is a tied-high node. In some embodiments, the reset signal and/or the system reset signal and/or the error reset signal is a normally HIGH signal.

The operation of the flip-flop circuit 200 is similar to that of the flip-flop circuit 100.

The flip-flop circuits in accordance with some embodiments specifically described herein are D flip-flop circuits. Other types of flip-flop circuits are usable in further embodiments. In some embodiments, the entire flip-flop circuit is manufactured by CMOS technology.

The flip-flop circuits in accordance with some embodiments achieve a 50% or substantially 50% duty cycle which is advantageous in certain applications where double edge sampling is used.

The flip-flop circuits in accordance with some embodiments achieve a full swing clock output (at the first output Q and second output QB) with the output voltage swings rail to rail, i.e., from a power supply voltage (VDD) to a ground voltage (VSS). In cases where a full swing clock output is not provided, although the speed performance is improvable, the small swing of the clock output makes it harder for the following circuits to use the clock output. To the contrary, flip-flop circuits in accordance with some embodiments achieve a full swing clock output, which is usable without difficulty by the following circuits, without sacrificing or significantly limiting the speed performance.

The flip-flop circuits in accordance with some embodiments are implementable in a wide range of frequency, e.g., from 0 to 20 GHz is suitable for System-on-Chip (SOC) and ultra-high frequency testing applications.

The flip-flop circuits in accordance with some embodiments are implementable as static flip-flop circuits with differential input clock with an improved speed performance over flip-flop circuits with single-end input clock.

The flip-flop circuits in accordance with some embodiments include a relatively low number of internal nodes and/or induce a relatively small delay. For example, in the flip-flop circuit 200 of FIG. 2, there are three intermediate nodes (e.g., N1, N5, and N2) in the current path from one input (e.g., the first input D) to the corresponding to output (e.g., the first output Q). The relatively low number (e.g., two) of inverters INV1-INV2 or INV3-INV4 also induces a relatively small delay.

Some embodiments obtain more than one of the above described effects.

Figure 3A:
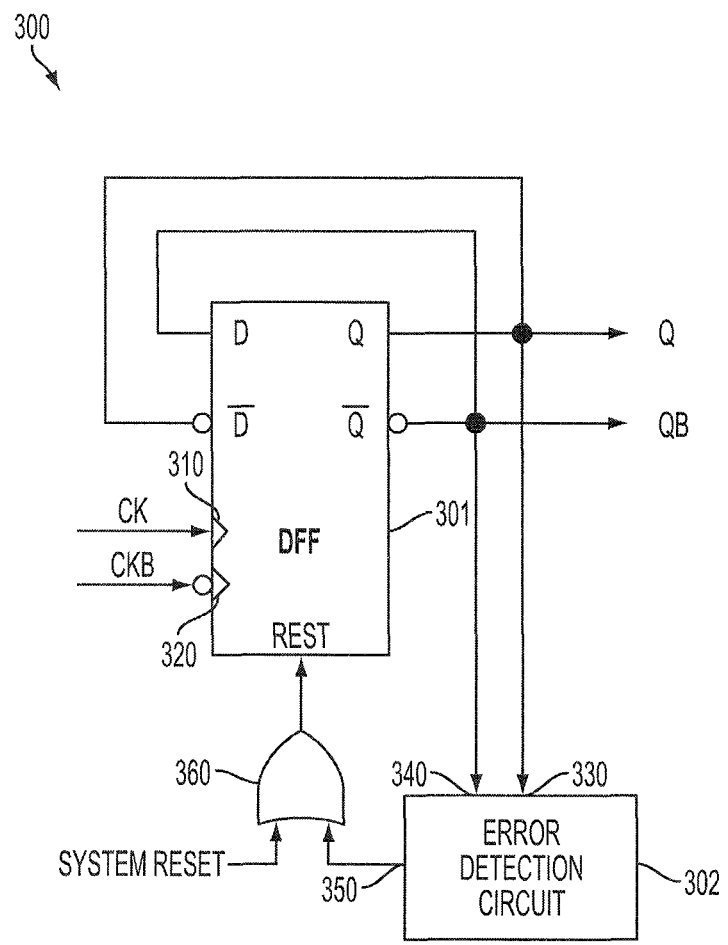
FIGS. 3A and 3B are schematic circuit diagrams of frequency dividers in accordance with some embodiments.

FIG. 3A is schematic circuit diagram of a frequency divider 300 in accordance with some embodiments. The frequency divider 300 includes a differential flip-flop circuit (DFF) 301 and an error detection circuit 302. The differential flip-flop circuit 301 includes a first clock input 310 configured to receive the clock signal CK, a second clock input 320 configured to receive the inverted clock signal CKB, the first and second inputs D and DB cross-coupled with the second and first outputs QB and Q, and the reset input (or reset terminal) REST. The differential flip-flop circuit 301 is configured to generate output signals at the first and second outputs Q, QB at a frequency being half of a frequency of the clock signal CK and the inverted clock signal CKB. In some embodiments, the differential flip-flop circuit 301 is implemented as any of the flip-flop circuits with differential input clock described herein, e.g., as the flip-flop circuit 200 of FIG. 2.

In a flip-flop circuit with differential input clock such as the flip-flop circuit 200 in FIG. 2, a steady error state is a possibility when the clock signal CK and the inverted clock signal CKB have the same level due to various factors and/or under certain operating conditions. Specifically, when the clock signal CK is the same as the inverted clock signal CKB, all four switches S1-S4 are closed at the same time, causing a potential steady error state where the first input D, the second input DB, the first intermediate node N1, the third intermediate node N3, the first output Q and the second output QB are all at the HIGH level (logical 1), whereas the second intermediate node N2 and the fourth intermediate node N4 are both at the LOW level (logical zero). The flip-flop circuit 200 stays in the steady error state until being reset.

The error detection circuit 302 is provided to detect a potential steady error state and reset the differential flip-flop circuit 301 when such a steady error state is detected. Specifically, the error detection circuit 302 includes a first input 330 coupled to the first output Q of the differential flip-flop circuit 301, a second input 340 coupled to the second output QB of the differential flip-flop circuit 301, and an output 350 coupled to an input of an OR gate 360. Another input of the OR gate 360 is coupled to receive a System Reset signal. An output of the OR gate 360 is coupled to the reset terminal REST of the differential flip-flop circuit 301. The OR gate 360 combines the System Reset signal with an error reset signal generated by the error detection circuit 302, and applies a reset signal to the reset terminal REST of the differential flip-flop circuit 301 when any one, or both, of the System Reset signal and the error reset signal is/are present at the corresponding inputs of the OR gate 360. In some embodiments, the System Reset signal is omitted, and the error reset signal is applied directly from the error detection circuit 302 to the reset terminal REST of the differential flip-flop circuit 301 without the intermediary of the OR gate 360. The error detection circuit 302 is configured to generate the error reset signal to reset the differential flip-flop circuit 301 upon a determination that the first and second outputs Q, QB of the differential flip-flop circuit 301 are at the same signal level (which indicates that a steady error state potentially exists). In one or more embodiments, the error detection circuit 302 compares the first output Q and second output QB, and generates the rest signal when the comparison indicates that Q=QB.

Figure 3B:
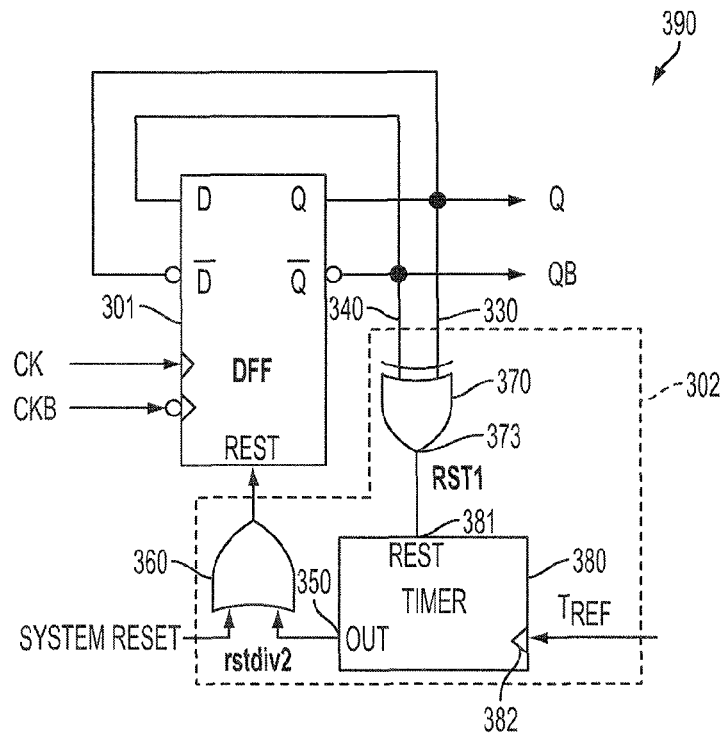

A specific implementation of the error detection circuit 302 in accordance with some embodiments is described with respect to FIG. 3B which is schematic circuit diagram of a frequency divider 390. Similarly to the frequency divider 300, the frequency divider 390 includes the differential flip-flop circuit 301 and the error detection circuit 302. The error detection circuit 302 in the frequency divider 390 includes a comparator 370 and a timer 380. The comparator 370 coupled to the first and second inputs 330, 340 of the error detection circuit 302 and configured to generate a comparison signal RST1 indicating whether or not the first and second outputs Q, QB of the differential flip-flop circuit 301 are at the same signal level or not. In the specifically disclosed embodiment of FIG. 3B, the comparator 370 is implemented by an XOR gate. However, any other comparator configuration is usable in further embodiments.

The timer 380 has an input 381 coupled to an output 373 of the comparator 370 to receive therefrom the comparison signal RST1. An output OUT of the timer 380 defines the output 350 of the error detection circuit 302. The timer 380 is configured to send an error reset signal rstdiv2 via the output 350 of the error detection circuit 302 and the OR gate 360 to the reset terminal REST of the differential flip-flop circuit 301 upon a determination that the first and second outputs Q, QB of the differential flip-flop circuit 301 are at the same signal level over a predetermined time period. The predetermined time period is selected to avoid "false alarm" situations where signal fluctuations cause the clock signal CK and inverted clock signal CKB to be equal over a brief time period insufficient to result in a steady error state. In some embodiments, the predetermined time period is determined by experiment, or simulation or calculation etc.

The timer 380 further includes a reference input 382 configured to receive a series of reference pulses Tref for counting a time period during which the first and second outputs Q, QB of the differential flip-flop circuit 301 are at the same signal level. When the counted time period reaches or exceeds the predetermined time period, the timer 380 issues the error reset signal rstdiv2 at the output 350. Other arrangements for the timer 380 to determine whether the first and second outputs Q, QB of the differential flip-flop circuit 301 are at the same signal level over the predetermined time period are implementable in further embodiments. In one or more embodiments, the timer 380 is omitted, and the comparator 370 issues the error reset signal rstdiv2 upon a determination that the first and second outputs Q, QB of the differential flip-flop circuit 301 are at the same signal level.

Figure 3C:
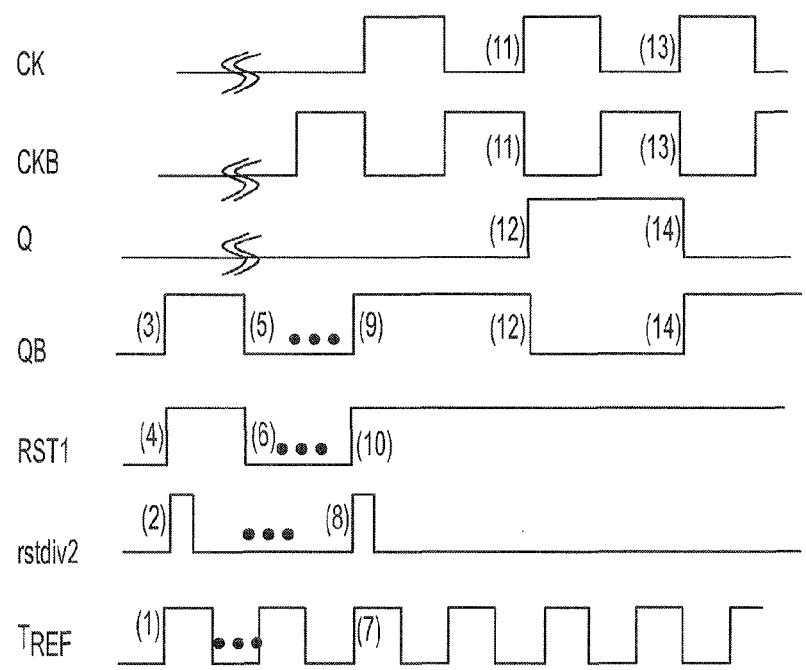
FIG. 3C is a timing diagram of an operation of the frequency divider of FIG. 3B.

FIG. 3C is a timing diagram of an operation of the frequency divider 390 of FIG. 3B. The numbers in parentheses in FIG. 3C include the operational sequence. Before starting-up, all signals are at the LOW level. Upon starting-up, a first pulse (1) among the series of reference pulses Tref applied to the reference input 382 of the timer 380 causes the timer 380 to generate at (2) the error reset signal rstdiv2 at the HIGH level which is applied to the reset terminal REST to reset the differential flip-flop circuit 301. The error reset signal rstdiv2 at the HIGH level causes the second output QB to be raised at (3) to the HIGH level, while the first output Q remains at the LOW level. The comparison signal RST1 is at the HIGH level at (4) due to the difference between the first output Q (LOW level) and second output QB (HIGH level).

After two periods of the clock signal CK, the second output QB switches to the LOW level at (5) while the first output Q is also at the LOW level due to the same signal level of clock signal CK and inverted clock signal CKB. The comparator 370 detects that Q=QB and issues at (6) a comparison signal RST1 at the LOW level. The timer 380 determines the time period during which the comparison signal RST1 remains at the LOW level (which indicates Q=QB). If the comparison signal RST1 returns to the HIGH level (i.e., Q≠QB) before the predetermined time period is reached, no further reset signal is generated by the timer 380 and the differential flip-flop circuit 301 operates normally, as described with respect to FIG. 1C.

However, if the comparison signal RST1 remains at the LOW level for the counted time period (at (7)) equal to or greater than the predetermined time period set in the timer 380, the timer 380 issues at (8) an error reset signal rstdiv2 at the HIGH level which is applied to the reset terminal REST to reset the differential flip-flop circuit 301 again. The second output QB is raised to the HIGH level at (9) due to the reset terminal REST. The comparison signal RST1 returns to the HIGH level at (10) due to the difference between the first output Q (LOW level) and second output QB (HIGH level). If CK≠CKB at this time, the differential flip-flop circuit 301 operates normally as indicated at (11)-(14). However, if CK continues to be equal to CKB, the actions described at (7)-(10) are repeated and the timer 380 keeps resetting the differential flip-flop circuit 301 to bring the differential flip-flop circuit 301 out of the steady error state.

In some embodiments, the error detection circuit 302 is a built-in circuit of the frequency divider 300. In other words, the entire frequency divider 300 including the differential flip-flop circuit 301 and the error detection circuit 302 is incorporated in a single chip. The chip in some embodiments is entirely made by CMOS technology.

Figure 4A:
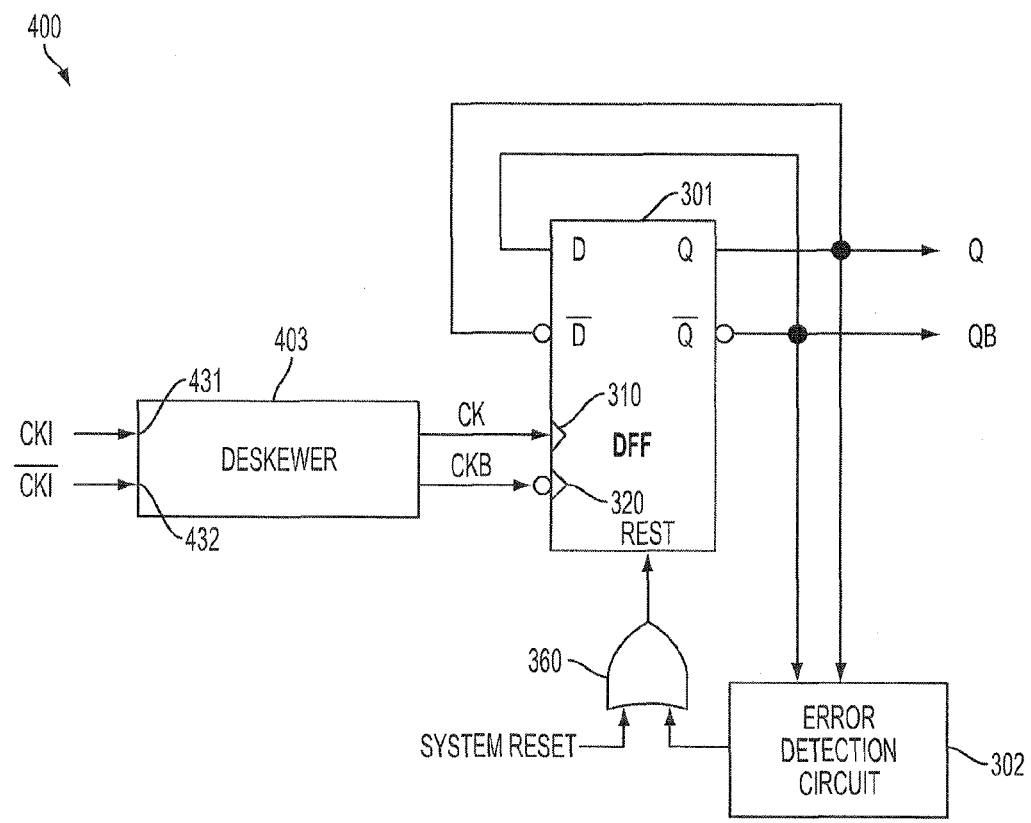
FIG. 4A is a schematic circuit diagram of a frequency divider in accordance with some embodiments.

FIG. 4A is a schematic circuit diagram of a frequency divider 400 in accordance with some embodiments. The frequency divider 400 is similar to the frequency divider 300, except for the addition of a deskewer or deskewing circuit 403. The deskewing circuit 403 includes a first input 431 configured to receive an initial clock signal CKI, a second input 432 configured to receive an initial inverted clock signal $\overline{CKI}$ (also interchangeably referred to herein as "CKIB") which is an inverted signal of the initial clock signal CKI. The deskewing circuit 403 further includes first and second outputs 410, 420 coupled to the first and second clock inputs 310, 320 of the differential flip-flop circuit 301, respectively.

Figure 4B:
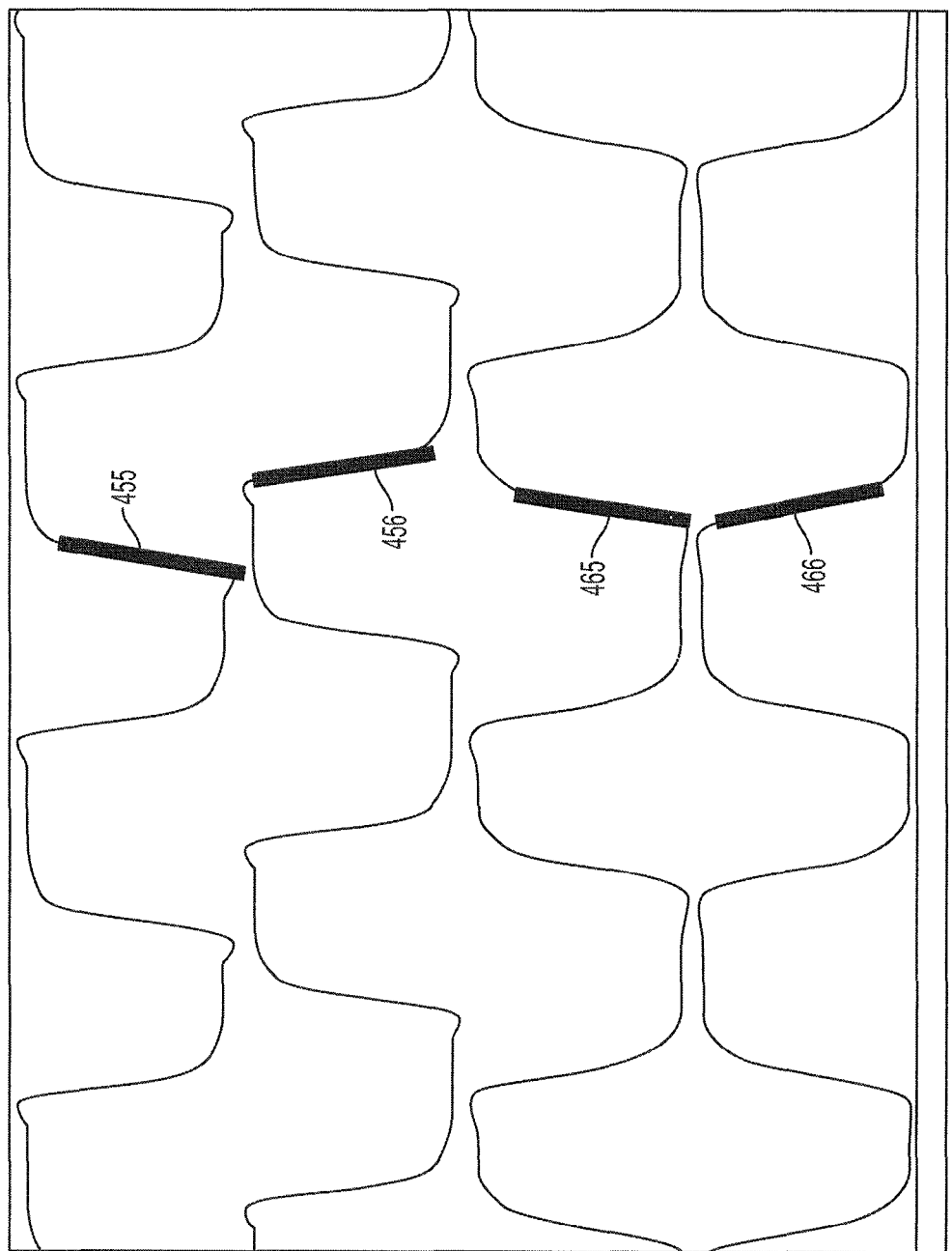
FIG. 4B is a timing diagram of an operation of a de-skewer in the frequency divider of FIG. 4B.

A skew may exist between the initial clock signal CKI and the initial inverted clock signal CKIB as illustrated in the top half of the timing diagram in FIG. 4B. Specifically, a rising edge 455 of the initial clock signal CKI and a falling edge 456 of the initial inverted clock signal CKIB, due to various factors and/or operating conditions, may not occur at the same or substantially at the same time. In the specific situation illustrated in FIG. 4C, the rising edge 455 of the initial clock signal CKI and the falling edge 456 of the initial inverted clock signal CKIB are shifted in time relative to each other by about 25% of the clock period. If such a clock input with 25% skew is supplied to the differential flip-flop circuit 301, the speed performance and/or duty cycle of the frequency divider 400 will be significantly affected.

The deskewing circuit 403 is configured to reduce the skew between the initial clock signal CKI and the initial inverted clock signal CKIB, and to output the clock signal CK and the inverted clock signal CKB with the reduced skew to the differential flip-flop circuit 301. Specifically, as illustrated in the bottom half of the timing diagram in FIG. 4B, a rising edge 465 of the clock signal CK at the output of the deskewing circuit 403 and a falling edge 466 of the inverted clock signal CKB at the output of the deskewing circuit 403 occur at the same or substantially at the same time. In some embodiments, skew between the clock signal CK and inverted clock signal CKB outputted by the deskewing circuit 403 is not greater than 2% of the clock period. The duty cycle and/or speed performance is thus improved when a deskewing circuit is placed upstream of the clock inputs of a differential flip-flop circuit in accordance with some embodiments.

Figure 4C:
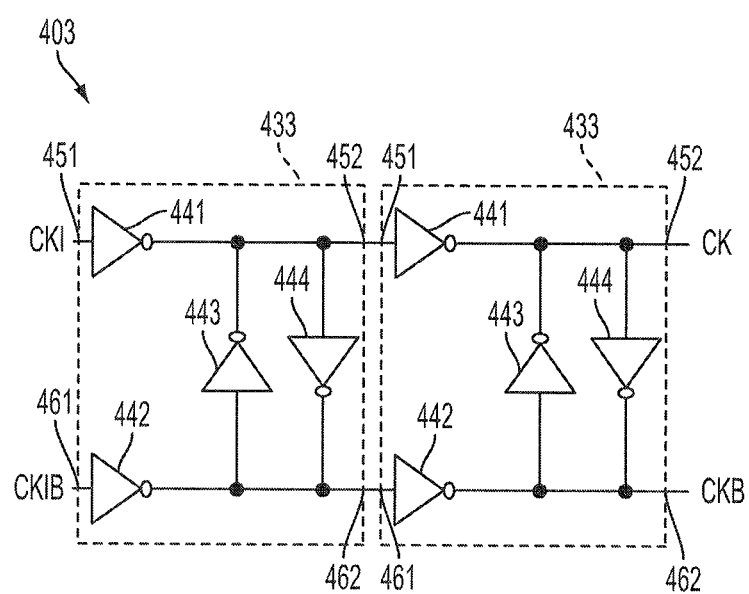
FIG. 4C is a schematic circuit diagram of a deskewing circuit in accordance with some embodiments, for use in the frequency divider of FIG. 4A.

FIG. 4C is a schematic circuit diagram of a deskewing circuit 403 in accordance with some embodiments, for use in the frequency divider 400 of FIG. 4A. The deskewing circuit 403 includes one or more deskewing units 433 connected in series between the inputs and outputs of the deskewing circuit 403. The specific embodiment illustrated in FIG. 4C includes two deskewing unit 433. Any other number of deskewing units 433 is implemented in further embodiments.

Each deskewing unit 433 includes a first inverter 441 coupled between a first input 451 and a first output 452 of the deskewing unit 433, a second inverter 442 coupled between a second input 461 and a second output 462 of the deskewing circuit 433, and a pair of third and fourth inverters 443, 444 cross-coupled between the outputs of the first and second inverters 441, 442. The outputs of the first and second outputs 452, 462 also define the first and second outputs 452, 462 of the deskewing unit 433. The first and second outputs 452, 462 of a preceding deskewing unit 433 are connected to the first and second inputs 451, 452 of the subsequent deskewing unit 433. The first and second inputs 451, 461 of the first deskewing unit 433 define the first and second inputs 431, 432 of the deskewing circuit 403 for receiving the initial clock signal CKI and the initial inverted clock signal CKIB. The first and second outputs 452, 462 of the last deskewing unit 433 define the first and second outputs 410, 420 of the deskewing circuit 403 from which the clock signal CK and inverted clock signal CKB are outputted to the differential flip-flop circuit 301.

In each deskewing unit 433, the inverters 441-443, especially the cross-coupled inverters 443, 444, are configured to reduce skew in the clock signal inputted into the deskewing unit 433. In some embodiments, a desired skew reducing effect is obtained by appropriately sizing the cross-coupled inverters 443, 444 relative to the other inverters 441, 442. Any other deskewing unit configurations are usable in further embodiments. For example, NAND gates are used in one or more embodiments to replace the inverters 441-444.

In some embodiments, the deskewing circuit 403 is a built-in circuit of the frequency divider 400. In other words, the entire frequency divider 400 including the differential flip-flop circuit 301, the error detection circuit 302 and the deskewing circuit 403 is incorporated in a single chip. The chip in some embodiments is entirely made by CMOS technology.

In some embodiments, the frequency divider 300 or 400 includes a plurality of cascades each comprising one differential flip-flop circuit 301. In some embodiments, the frequency divider further includes at least one error detection circuit 302 coupled to the outputs of the differential flip-flop circuit 301 in one of the cascade. In some embodiments, each cascade includes a separate error detection circuit 302. In some embodiments, the frequency divider includes one deskewing circuit 403 coupled to the clock inputs of the differential flip-flop circuit 301 of the first cascade.

Figure 5:
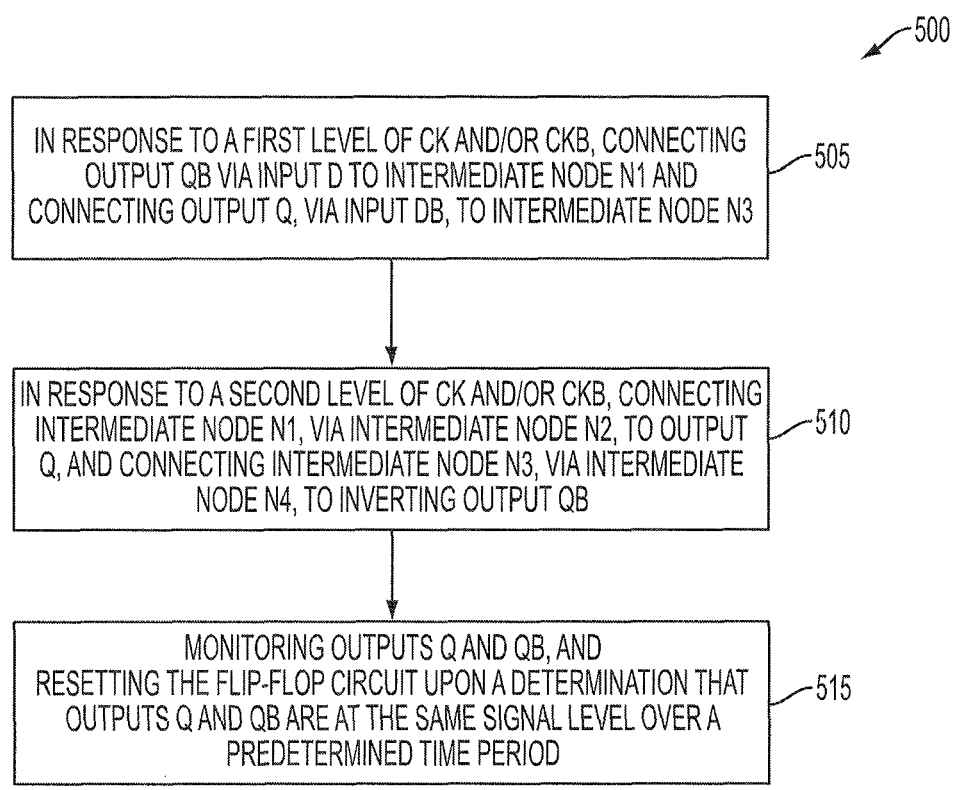
FIG. 5 is a flow chart of a frequency dividing method in accordance with some embodiments.

FIG. 5 is a flow chart of a frequency dividing method 500 in accordance with some embodiments. The method is performed by a flip-flop circuit and/or frequency divider in accordance with the embodiments described herein.

At step 505, in response to a first level of a clock signal, an inverting output of a flip-flop circuit is connected to a first intermediate node and a non-inverting output of the flip-flop circuit is connected to a second intermediate node. For example, in the flip-flop circuit 100 of FIG. 1A or the flip-flop circuit 200 of FIG. 2, when the clock signal CK is at the HIGH level (and/or the inverted clock signal CKB is at the LOW level), the inverting output QB of the flip-flop circuit is connected, via the non-inverting input D, to the first intermediate node N1, and the non-inverting output Q of the flip-flop circuit is connected, via the inverting input DB, to the third intermediate node N3.

At step 510, in response to a second level of the clock signal, the first intermediate node is connected to the non-inverting output and the second intermediate node is connected to the inverting output. For example, in the flip-flop circuit 100 of FIG. 1A or the flip-flop circuit 200 of FIG. 2, when the clock signal CK is at the LOW level (and/or the inverted clock signal CKB is at the HIGH level), the first intermediate node N1 is connected, via the second intermediate node N2, to the non-inverting output Q, and the third intermediate node N3 is connected, via the fourth intermediate node N4, to the inverting output QB.

As a result of the steps 505, 510 and by arranging the first cross-coupled gates arrangement CCG1 between the first intermediate node N1 and third intermediate node N3, and the second cross-coupled gates arrangement CCG2 between the second intermediate node N2 and fourth intermediate node N4, the frequency of the clock signal CK (and/or the inverted clock signal CKB) is divided by 2 at the outputs of the flip-flop circuit, as described with respect to FIG. 1C.

At step 515, the first output Q and second output QB of the flip-flop circuit are monitored, and the flip-flop circuit is reset upon a determination that the outputs Q and QB are at the same signal level over a predetermined time period. For example, in the frequency divider 300 of FIG. 3A or the frequency divider 400 of FIG. 4A where the flip-flop circuit 301 is a differential flip-flop circuit responsive to both the clock signal CK and the inverted clock signal CKB, a steady error state caused by CK=CKB may occur. By monitoring the first and second outputs Q, QB of the flip-flop circuit 301 (e.g., by a comparator 370 described with respect to FIG. 3B) and resetting (e.g., by a timer 380 described with respect to FIG. 3B) the flip-flop circuit upon a determination that a steady error state exists, the steady error state of the frequency divider is eliminable, as described with respect to FIG. 3C. In some embodiments, step 515 is omitted.

The above method embodiment shows exemplary steps, but they are not necessarily required to be performed in the order shown. Steps may be added, replaced, changed order, and/or eliminated as appropriate, in accordance with the spirit and scope of embodiments of the disclosure. Embodiments that combine different features and/or different embodiments are within scope of the disclosure and will be apparent to those skilled in the art after reviewing this disclosure.

According to some embodiments, a flip-flop circuit comprises first and second inputs, a first output coupled to the second input, and a second output coupled to the first input. First and second switches are coupled in series between the first input and the first output. A first intermediate node is between the first and second switches. A second intermediate node is between the second switch and the first output. Third and fourth switches are coupled in series between the second input and the second output. A third intermediate node is between the third and fourth switches. A fourth intermediate node is between the fourth switch and the second output. A first cross-coupled gates arrangement is coupled between the first and third intermediate nodes. A second cross-coupled gates arrangement is coupled between the second and fourth intermediate nodes. The first and third switches are configured to be closed in response to a first level of a clock signal and opened in response to a second level of the clock signal. The second and fourth switches are configured to be opened in response to the first level of the clock signal and closed in response to the second level of the clock signal.

According to some embodiments, a frequency divider comprises a differential flip-flop circuit and an error detection circuit. The differential flip-flop circuit includes a first clock input configured to receive a clock signal, a second clock input configured to receive an inverted clock signal being an inverted signal of the clock signal, first and second inputs, a first output coupled to the second input, a second output coupled to the first input, and a reset terminal. The differential flip-flop circuit is configured to generate output signals at the first and second outputs at a frequency being half of a frequency of the clock signal and the inverted clock signal. The error detection circuit includes a first input coupled to the first output of the differential flip-flop circuit, a second input coupled to the second output of the differential flip-flop circuit, and an output coupled to the reset terminal of the differential flip-flop circuit. The error detection circuit is configured to generate a reset signal to reset the differential flip-flop circuit upon a determination that the first and second outputs of the differential flip-flop circuit are at the same signal level.

According to some embodiments, a method of dividing a frequency of a clock signal includes, in response to a first level of the clock signal, connecting an inverting output of a flip-flop circuit, via a non-inverting input thereof, to a first intermediate node of the flip-flop circuit and connecting a non-inverting output of the flip-flop circuit, via an inverting input thereof, to a second intermediate node of the flip-flop circuit. The method further includes, in response to a second level of the clock signal, connecting the first intermediate node, via a third intermediate node of the flip-flop circuit, to the non-inverting output and connecting the second intermediate node, via a fourth intermediate node of the flip-flop circuit, to the inverting output. A first cross-coupled gates arrangement of the flip-flop circuit is coupled between the first and second intermediate nodes. A second cross-coupled gates arrangement of the flip-flop circuit is coupled between the third and fourth intermediate nodes.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A flip-flop circuit, comprising:
   first and second inputs;
   a first output coupled to the second input;
   a second output coupled to the first input;
   first and second switches coupled in series between the first input and the first output, a first intermediate node between the first and second switches, a second intermediate node between the second switch and the first output;
   third and fourth switches coupled in series between the second input and the second output, a third intermediate node between the third and fourth switches, a fourth intermediate node between the fourth switch and the second output;
a first cross-coupled gates arrangement coupled between the first and third intermediate nodes;
a second cross-coupled gates arrangement coupled between the second and fourth intermediate nodes; and
wherein
the first and third switches are configured to be closed in response to a first level of a clock signal and opened in response to a second level of the clock signal; and
the second and fourth switches are configured to be opened in response to the first level of the clock signal and closed in response to the second level of the clock signal.

2. The flip-flop circuit of claim 1, wherein at least one of the first through fourth switches is configured to receive an inverted clock signal, the inverted clock signal being an inverted signal of the clock signal.

3. The flip-flop circuit of claim 1, wherein at least one of the first through fourth switches is configured to receive both the clock signal and an inverted clock signal, the inverted clock signal being an inverted signal of the clock signal.

4. The flip-flop circuit of claim 3, further comprising:
an inverter configured to receive the clock signal and to invert the clock signal to generate the inverted clock signal.

5. The flip-flop circuit of claim 1, wherein each of the first and second cross-coupled gates arrangements includes a pair of logic gates each having an input coupled to an output of the other and to a corresponding one of the first through fourth intermediate nodes.

6. The flip-flop circuit of claim 1, further comprising
a first inverter coupled between the first intermediate node and the second switch;
a second inverter coupled between the second intermediate node and the first output;
a third inverter coupled between the third intermediate node and the fourth switch; and
a fourth inverter coupled between the fourth intermediate node and the second output.

7. The flip-flop circuit of claim 6, wherein
the first cross-coupled gates arrangement includes first and second logic gates, and the second cross-coupled gates arrangement includes third and fourth logic gates;
the first logic gate includes an input coupled to an output of the second logic gate and to the third intermediate node;
the second logic gate includes an input coupled to an output of the first logic gate and to the first intermediate node;
one of the first and second logic gates includes another input coupled to a node of a predetermined logic level;
the third logic gate includes an input coupled to an output of the fourth logic gate and to the fourth intermediate node;
the fourth logic gate includes an input coupled to an output of the third logic gate and to the second intermediate node; and
one of the third and fourth logic gates includes another input coupled to a node of a predetermined logic level.

8. The flip-flop circuit of claim 7, wherein at least one of the other one of the first and second logic gates or the other one of the third and fourth logic gates includes a reset input configured to receive a reset signal.

9. The flip-flop circuit of claim 8, wherein the first through fourth switches are transmission gates.

10. A frequency divider, comprising:
a differential flip-flop circuit comprising:
a first clock input configured to receive a clock signal;
a second clock input configured to receive an inverted clock signal, the inverted clock signal being an inverted signal of the clock signal;
first and second inputs;
a first output coupled to the second input;
a second output coupled to the first input, the differential flip-flop circuit configured to generate output signals at the first and second outputs at a frequency being half of a frequency of the clock signal and the inverted clock signal; and
a reset terminal; and
an error detection circuit comprising:
a first input coupled to the first output of the differential flip-flop circuit;
a second input coupled to the second output of the differential flip-flop circuit; and
an output coupled to the reset terminal of the differential flip-flop circuit, the error detection circuit configured to generate a reset signal to reset the differential flip-flop circuit upon a determination that the first and second outputs of the differential flip-flop circuit are at the same signal level.

11. The frequency divider of claim 10, wherein the error detection circuit is further configured to send the reset signal to the reset terminal of the differential flip-flop circuit upon a determination that the first and second outputs of the differential flip-flop circuit are at the same signal level over a predetermined time period.

12. The frequency divider of claim 10, wherein the error detection circuit further comprises:
a comparator coupled to the first and second inputs of the error detection circuit and configured to generate a comparison signal indicating whether or not the first and second outputs of the differential flip-flop circuit are at the same signal level; and
a timer coupled between the comparator and the output of the error detection circuit, the timer configured to send the reset signal via the output of the error detection circuit to the reset terminal of the differential flip-flop circuit upon a determination that the first and second outputs of the differential flip-flop circuit are at the same signal level over a predetermined time period.

13. The frequency divider of claim 12, wherein the error detection circuit further comprises:
a reference input configured to receive a series of reference pulses for counting a time period during which the first and second outputs of the differential flip-flop circuit are at the same signal level.

14. The frequency divider of claim 10, wherein the differential flip-flop circuit further comprises:
first and second switches coupled in series between the first input and the first output, a first intermediate node between the first and second switches, a second intermediate node between the second switch and the first output;
third and fourth switches coupled in series between the second input and the second output, a third intermediate node between the third and fourth switches, a fourth intermediate node between the fourth switch and the second output; and
a first cross-coupled gates arrangement coupled between the first and third intermediate nodes;
a second cross-coupled gates arrangement coupled between the second and fourth intermediate nodes;
wherein
the first and third switches are coupled to the first and second clock inputs and configured to be closed in response to a first level of the clock signal and opened in response to a second level of the clock signal; and the second and fourth switches are coupled to the first and second clock inputs and configured to be opened in response to the first level of the clock signal and closed in response to the second level of the clock signal.

15. The frequency divider of claim 14, wherein each of the first and second cross-coupled gates arrangements includes a pair of logic gates each having an input coupled to an output of the other and to a corresponding one of the first through fourth intermediate nodes; and at least one of the logic gates further has a reset input coupled to the reset terminal of the differential flip-flop circuit to receive the reset signal from the error detection circuit.

16. The frequency divider of claim 10, further comprising a deskewing circuit comprising a first input configured to receive an initial clock signal;

a second input configured to receive an initial inverted clock signal being an inverted signal of the initial clock signal;

first and second outputs coupled to the first and second clock inputs of the differential flip-flop circuit, respectively, the deskewing circuit configured to reduce skew between the initial clock signal and the initial inverted clock signal, and to output the clock signal and the inverted clock signal at the first and second outputs of the deskewing circuit, respectively.

17. The frequency divider of claim 16, wherein the deskewing circuit further comprises at least one deskewing unit having a first inverter coupled between the first input and first output of the deskewing circuit;

a second inverter coupled between the second input and second output of the deskewing circuit; and a pair of third and fourth inverters cross-coupled between outputs of the first and second inverters.

18. The frequency divider of claim 10, comprising a plurality of cascades each comprising one said differential flip-flop circuit and one said error detection circuit.

19. A method of dividing a frequency of a clock signal, said method comprising:

in response to a first level of the clock signal, connecting an inverting output of a flip-flop circuit, via a non-inverting input thereof, to a first intermediate node of the flip-flop circuit and connecting a non-inverting output of the flip-flop circuit, via an inverting input thereof, to a second intermediate node of the flip-flop circuit, a first cross-coupled gates arrangement of the flip-flop circuit coupled between the first and second intermediate nodes; and in response to a second level of the clock signal, connecting the first intermediate node, via a third intermediate node of the flip-flop circuit, to the non-inverting output and connecting the second intermediate node, via a fourth intermediate node of the flip-flop circuit, to the inverting output, a second cross-coupled gates arrangement of the flip-flop circuit coupled between the third and fourth intermediate nodes.

20. The method of claim 19, wherein the flip-flop circuit is a differential flip-flop circuit responsive to both the clock signal and an inverted clock signal, the inverted clock signal being an inverted signal of the clock signal, said method further comprising:

monitoring the first and second outputs of the flip-flop circuit; and resetting the flip-flop circuit upon a determination that the first and second outputs of the flip-flop circuit are at the same signal level over a predetermined time period.

* * * * *